US009795989B2

(12) United States Patent
Stevens et al.

(10) Patent No.: US 9,795,989 B2
(45) Date of Patent: *Oct. 24, 2017

(54) COMBINING DIFFERENT TYPES OF MOISTURE-RESISTANT MATERIALS

(71) Applicant: HzO, Inc., Draper, UT (US)

(72) Inventors: Blake Stevens, Morristown, NJ (US); Yang Yun, Draper, UT (US); Sean O. Clancy, Draper, UT (US)

(73) Assignee: HZO, Inc., Draper, UT (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/864,644

(22) Filed: Sep. 24, 2015

(65) Prior Publication Data

US 2016/0014923 A1 Jan. 14, 2016

Related U.S. Application Data

(63) Continuation-in-part of application No. 14/213,765, filed on Mar. 14, 2014.

(60) Provisional application No. 61/786,579, filed on Mar. 15, 2013, provisional application No. 61/786,561, filed on Mar. 15, 2013.

(51) Int. Cl.
*B05D 1/00* (2006.01)
*C09D 5/00* (2006.01)
*C09D 165/04* (2006.01)
*H05K 3/28* (2006.01)

(52) U.S. Cl.
CPC ............... *B05D 1/60* (2013.01); *C09D 5/00* (2013.01); *C09D 165/04* (2013.01); *H05K 3/284* (2013.01); *H05K 2201/015* (2013.01); *H05K 2203/1322* (2013.01); *Y10T 428/24802* (2015.01); *Y10T 428/24942* (2015.01); *Y10T 428/31504* (2015.04)

(58) Field of Classification Search
CPC .... Y10T 428/31504; Y10T 428/31536; C09D 165/04; H05K 3/284
See application file for complete search history.

(56) References Cited

U.S. PATENT DOCUMENTS

| | | |
|---|---|---|
| 5,137,780 A | 8/1992 | Nichols et al. |
| 5,536,892 A * | 7/1996 | Dolbier, Jr. ........... C07C 17/269 570/127 |
| 5,595,625 A | 1/1997 | Fishel et al. |
| RE43,651 E | 9/2012 | Badyal et al. |
| 2006/0003090 A1 * | 1/2006 | Rodger ................ A61N 1/0551 427/96.1 |
| 2012/0051007 A1 | 3/2012 | Alvarez et al. |

OTHER PUBLICATIONS

United States Patent and Trademark Office Acting as the International Search Authority, "International Search Report and Written Opinion," mailed Aug. 1, 2014, in related PCT application No. PCT/2014/029686.

* cited by examiner

*Primary Examiner* — Gerard Higgins
(74) *Attorney, Agent, or Firm* — Kunzler Law Group

(57) ABSTRACT

Protective coatings, including moisture-resistant coatings, that include two or more different types of moisture-resistant materials are disclosed, as are moisture-sensitive substrates that include such protective coatings. Moisture-sensitive substrates that include different types of moisture-resistant coatings on different elements are also disclosed.

8 Claims, 1 Drawing Sheet

COMBINING DIFFERENT TYPES OF MOISTURE-RESISTANT MATERIALS

CROSS-REFERENCE TO RELATED APPLICATIONS

This application is a continuation-in-part of U.S. patent application Ser. No. 14/213,765, filed on Mar. 14, 2014, and titled COMBINING DIFFERENT TYPES OF MOISTURE-RESISTANT MATERIALS ("the '765 Application"), which claims the benefit of priority under 35 U.S.C. §119(e) to the Mar. 15, 2013, filing date of U.S. Provisional Patent Application No. 61/786,579, titled COATINGS AND METHODS INCLUDING DIFFERENT TYPES OF MOISTURE RESISTANT MATERIALS ("the '579 Provisional Application), and to the Mar. 15, 2013, filing date of U.S. Provisional Patent Application No. 61/786,561, titled ELECTRONIC DEVICES WITH DIFFERENT TYPES OF COATINGS ON DIFFERENT FEATURES ("the '561 Provisional Application"). The entire disclosure of each of the '765 Application, the '579 Provisional Application and the '561 Provisional Application are hereby incorporated herein.

TECHNICAL FIELD

This disclosure relates generally to the use of different types of moisture-resistant materials in combination. More specifically, this disclosure relates to protective coatings that include two or more types of moisture-resistant materials, and to moisture-sensitive substrates that include such protective coatings. This disclosure also relates to moisture-sensitive substrates with different types of moisture-resistant materials on different elements.

SUMMARY

As used herein, the terms "moisture-resistant" and "moisture-resistance" refer to the ability of a coating to prevent exposure of a coated element or feature to moisture. As an example, a moisture-resistant coating may resist wetting or penetration by one or more types of moisture, or it may be impermeable to one or more types of moisture or substantially impermeable to one or more types of moisture—the term "substantially" indicating that over long durations of time, some moisture may migrate through the coating. Both moisture impermeable and substantially moisture impermeable barriers are, for the sake of simplicity, referred to herein as "moisture impermeable" barriers. As another example, a moisture-resistant coating may repel one or more types of moisture; for example, it may the moisture-resistant coating may have an outer surface that is configured (e.g., structurally (e.g., lotus leaf-type structures), chemically (e.g., hydrophobic materials) to repel moisture.

In some embodiments, a moisture-resistant coating may be impermeable to, substantially impermeable to and/or repel water, an aqueous solution (e.g., salt solutions, acidic solutions, basic solutions, drinks) or vapors of water or other aqueous materials (e.g., humidity, fogs, mists, wetness). Use of the term "moisture-resistant" to modify the term "coating" should not be considered to limit the scope of materials from which the coating protects one or more components of an electronic device. The terms "moisture-resistant" and "moisture-resistance" may also refer to the ability of a coating to restrict permeation of or repel organic liquids or vapors (e.g., organic solvents, other organic materials in liquid or vapor form), as well as a variety of other substances, corrosive materials or conditions that might pose a threat to a substrate (e.g., a moisture-sensitive substrate), such as an electronic device or its components.

In one aspect, this disclosure relates to protective coatings. A protective coating according to this disclosure may include two or more different types of moisture-resistant materials or two or more similar moisture-resistant materials with different properties (e.g., microbial resistance; resistance to ultraviolet (UV) light, or "UV resistance"). In some embodiments, the two or more different types of moisture-resistant materials may comprise discernibly discrete portions (e.g., sub-layers) of the protective coating. In other embodiments, the protective coating may include a gradient, or gradual transition, between two or more different types of moisture-resistant materials.

Methods for forming such a protective coating are also disclosed. Such a method may include separately defining (e.g., depositing) portions of a protective coating. Alternatively, two or more types of moisture-resistant materials may be co-deposited. As another option, different types of moisture-resistant materials may be deposited in a sequential, overlapping manner, which may result in coatings that include material gradients, or are graded.

According to another aspect, a substrate may include at least one protective coating that includes two or more different moisture-resistant materials. In embodiments where the first type of moisture-resistance includes impermeability to moisture and the second type of moisture-resistance includes moisture-repellence, the second type of moisture-resistance may be disposed atop the first type of moisture-resistance. Alternatively, the second type of moisture-resistance may be located closer than the first type of moisture-resistance to a substrate, such as a component or other feature of an electronic device.

In addition, or as an alternative, a substrate may include different elements that are protected by protective coatings formed from different types of moisture-resistant materials. In a specific embodiment, a moisture-repellant material may be applied to some elements, while a moisture barrier may be applied to other elements.

Such an embodiment of moisture-resistant protection may be particularly useful for protecting state of the art mobile electronic devices from accidental or incidental exposure to moisture. One material may provide the primary type of moisture-resistance—a moisture-impermeable coating or barrier that covers and seals or substantially seals at least some moisture-sensitive components or other features within the interior of an electronic device in a manner (e.g., confluently) that will prevent moisture from contacting those components or other features, should moisture enter into the interior of the electronic device. However, confluent coatings may have a detrimental effect on the performance or even the operation of some components of an electronic device (e.g., microphones, speakers, optical elements). Nonetheless, those components and/or the electronic device(s) of which they are a part may benefit from moisture resistance (e.g., by preventing moisture from entering into the interior of such a component, into the interior of the electronic device of which the component is a part).

The secondary type of moisture resistance provided by another material may not provide the same degree of resistance to moisture as the primary type of moisture resistance. In any event, the material providing the secondary type of moisture resistance may be used to coat components or other features that are not compatible with the primary type of moisture resistance, but are compatible with a less protective type of moisture resistance. Providing components or other features with the secondary type of moisture resistance will impart those components or features with at least some ability to withstand exposure to moisture, which is better protection than those components or features would receive if they were to lack protection against moisture. Some embodiments of the secondary layer may be configured to enable electrical communication therethrough; for example, a secondary layer may be electrically conductive or it may be too thin to prevent electricity from passing therethrough. In other embodiments, the thickness (or thinness) of the secondary layer may enable its ready removal from electrically conductive features (e.g., communication ports, contacts) to expose the same and, thus, to facilitate electrical connections to the exposed electrically conductive features.

In other various embodiments, the substrate may comprise an industrial device, a vehicular device, a precision mechanical device, a medical device, a scientific instrument, an article of clothing or the like.

Some components or features of a moisture-sensitive substrate, such as an electronic device, may lack a moisture-resistant coating or barrier. These components or features may include, but are not limited to, surfaces of components and/or features exposed to an exterior of the moisture-sensitive substrate, as well as components and/or features located within an interior of the moisture-sensitive substrate.

Other aspects, as well as features and advantages of various aspects, of the disclosed subject matter will be apparent to those of ordinary skill in the art through consideration of this disclosure and the appended claims.

DETAILED DESCRIPTION

Figure 1:
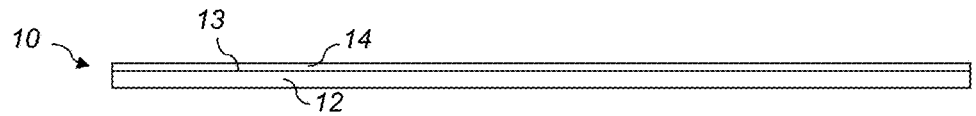
FIG. 1 provides a cross-sectional representation of an embodiment of a protective coating that includes two portions comprising different materials, with a discernible boundary between the two portions in accordance with embodiments of the disclosed subject matter.

With reference to FIG. 1, an embodiment of a protective coating 10 is illustrated. The protective coating 10 may, as illustrated, comprise a film, although other configurations of protective structures are also within the scope of this disclosure. The protective coating 10 includes at least two different materials 12, 14 and is configured to provide moisture-resistance. In protective coating 10, the materials 12, 14 define different portions of the protective coating 10, such as the sub-layers or sub-coatings illustrated by FIG. 1. In such an embodiment, a visibly discernible boundary 13 may exist between the discrete portions that are defined by two different materials 12 and 14. The two different materials 12 and 14 may respectively define a first coating layer 18 and a second coating layer 20.

In a specific embodiment, the material 12 of the first coating layer 18 may be a parylene C (poly(chloro-p-xylylene)), which may provide a moisture barrier superior to other known parylenes. The second material 14 of the second coating layer 20 may be a parylene AF-4 (poly($\alpha, \alpha,\alpha',\alpha'$-tetrafluoro-p-xylylene) or parylene VT-4 (poly(tetrafluoro-p-xylylene, with all four fluorine groups on the aromatic ring) (i.e., parylene F) on top of or overlaying the first coating layer 18. Parylene AF-4 may include properties that protect the second coating layer 20, as well as portions of the underlying first coating layer 18 and/or portions of a substrate that are covered by the parylene AF-4 from UV light. Parylene VT-4 may provide thermal stability (i.e., resist degradation when exposed to elevated temperatures) when a less stable material (i.e., the first material 12) is used to form the first coating layer 18; thus, the use of parylene VT-4 may reduce the probability that repeated heating and cooling of a substrate (e.g., repeated use, or operational cycling, of an electronic device) will damage the first coating layer 18. The first coating layer 18 may be thicker than the second coating layer 20 because the first coating layer 18 is more desirable for moisture resistant properties. The second coating layer 20 does not need to be as thick to provide the UV protection, to withstand elevated temperatures or to provide other protective properties.

It will be appreciated that multiple types of coatings may be used to create the protective coating 10 with at least a first coating layer 18 and a second coating layer 20. Other possible parylenes may be used (e.g., parylene N, or poly (p-xylylene); parylene D, or poly(dichloro-p-xylylene); parylene A (amino-modified parylene)); as well as other coatings such as coatings formed by plasma processes (e.g., plasma-enhanced chemical vapor deposition (PECVD) processes), metal oxide coatings (which may be formed through atomic layer deposition (ALD) processes) and other conformal coatings.

With continued reference to FIG. 1, another specific embodiment of a protective coating 10 may include a first coating layer 18 in which the first material 12 comprises a metal oxide and a second coating layer 20 in which the second material 14 comprises a polymer. Even more specifically, the first coating layer 18 may be formed via an ALD process wherein the metal oxide layer is 0.5 nm thick to about 400 nm thick and is deposited directly on a substrate. After deposition of the first coating layer 18, a second coating layer 20 may be formed from a polymer, which may be a parylene, which can be anywhere from about 0.5 microns thick to about 25 microns thick. The polymer of the second coating layer 20 may provide moisture resistance (e.g., water resistance, liquid resistance), as well as those other properties recited previously herein (e.g., UV protection). The first coating layer 18 may also provide moisture resistance and/or other protective properties. The first coating layer 18 may allow for electrical connect-through (i.e., the establishment of electrical connections therethrough) if the second coating layer 20 is "punched" through (i.e., an aperture is formed through a location of the second layer 20 at which an electrical connection is to be established) before an effort is made to establish the electrical connection. It will be appreciated that the first layer 18 and the second layer 20 may be deposited on the surface of a substrate in different orders and in varying degrees and thicknesses.

Figure 2:
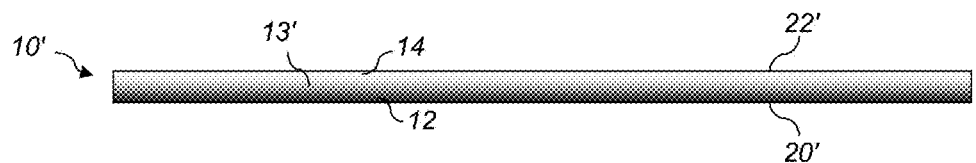
FIG. 2 is a cross-sectional representation of another embodiment of protective coating, which includes a gradient of at least two different materials in accordance with embodiments of the disclosed subject matter.

FIG. 2 illustrates another embodiment of protective coating 10'. Instead of a discernible boundary 13 (FIG. 1), protective coating 10' includes a transition 13', or gradient, between two or more materials 12 and 14. Thus, a base 20' of the protective coating 10' may consist of or consist essentially of a first material 12, and an outer surface 22' of the protective coating 10' may consist of or consist essentially of a second material 14, but at least some regions therebetween, such as the transition 13, include two or more materials, such as material 12 and material 14. In a specific embodiment, the gradient 13' may include a transition between a parylene C (which may be the first material 12) and parylene AF-4 (which may be the second material 14) so as to achieve the properties of moisture resistance and UV resistance as previously described herein, but in a transitional manner rather than two distinct and delineated layers. A gradient 13' may also be used to achieve other protective combinations; for example, a combination of the moisture resistance provided by parylene C and the thermal stability provided by parylene VT-4.

Figure 3:
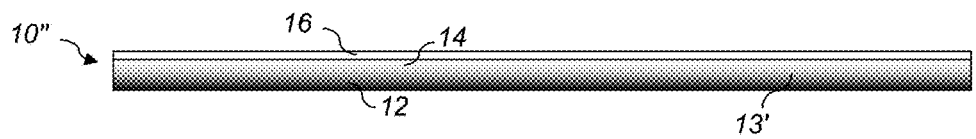
FIG. 3 provides a cross-sectional representation of yet another embodiment of protective coating, which includes a material that defines a portion that is discrete from at least one other portion of the protective coating, as well as a portion that includes a gradient between two or more materials in accordance with embodiments of the disclosed subject matter.

As illustrated by FIG. 3, protective coatings 10" that include one or more materials 16 that define a corresponding number of discrete portions, as well as two or more materials 12 and 14 that define a portion with a transition 13', are also within the scope of this disclosure.

The two or more portions of a protective coating 10, 10', 10" may be superimposed across an entire extent of the protective coating 10, 10', 10" or across substantially all of the protective coating 10, 10', 10".

Figure 4:
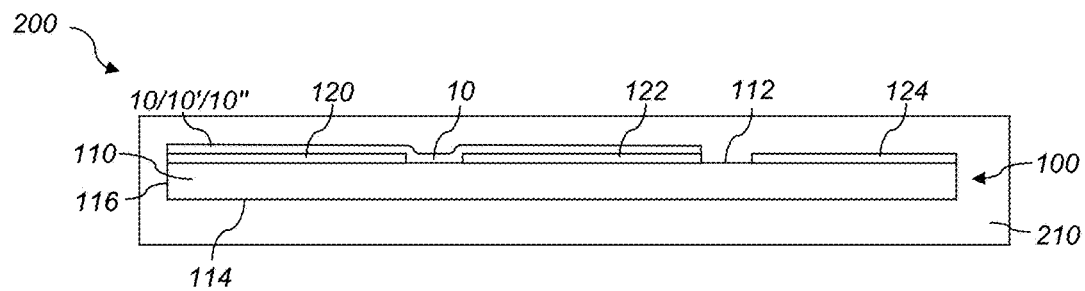
FIG. 4 illustrates an embodiment of a substrate that includes a protective coating that comprises at least two different materials in accordance with embodiments of the disclosed subject matter.
Figure 5:
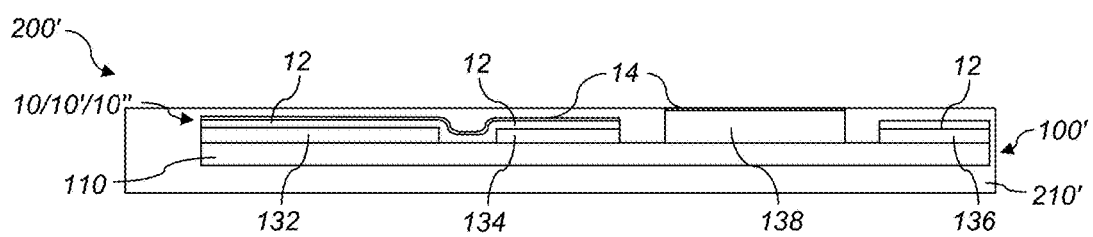
FIG. 5 depicts an embodiment of a substrate with different elements that are at least partially covered with protective coatings that include different materials from one another in accordance with embodiments of the disclosed subject matter.

In some embodiments, each material 12, 14, 16 of a protective coating 10, 10', 10" may comprise a moisture-resistant material. Alternatively, an outermost material 14, 16 may comprising a capping material that may protect and/or enhance a moisture-resistant property of an underlying moisture-resistant material 12, 14. As another alternative, a material 12 at a base of the protective coating 10, 10', 10" may promote adhesion between a moisture-resistant material 14 and a substrate 100, 100' (FIGS. 4 and 5, respectively). Optionally, a portion of a protective coating 10, 10', 10" (e.g., material 12, material 14, material 16) may impart the protective coating 10, 10', 10" with at least one desired characteristic (e.g., thermal conductivity, electrical insulation, UV protection, thermal stability, adhesion, hydrophobicity, hydrophilicity, a desired texture, a desired surface finish).

In some embodiments where at least two materials 12, 14—and the corresponding portions—of a protective coating 10, 10', 10" comprise moisture-resistant materials, both materials 12, 14 may provide the same type or similar types of moisture resistance. As an example, materials 12 and 14 may both be substantially impermeable to water or impermeable to water, although material 12 may have a different impermeability to water than material 14. In addition to providing the same type or substantially the same type of moisture-resistance, one of the materials 12, 14 may provide an additional type of moisture resistance from the other of the materials 14, 12. As an example, material 14 may be moisture-impermeable, while material 12 may be impermeable to moisture and repel moisture. In a specific embodiment, a material 12 at the base of a protective coating 10, 10', 10" may be formed from parylene C (as previously disclosed herein), which is a polyp-xylylene) in which some hydrogens have been replaced with chlorine, while a material 14 at an outer portion of the protective coating 10, 10', 10" may include a parylene with some fluorine substitutions (such as parylene AF-4 or parylene VT-4, as previously disclosed herein). The fluorine substitutions of such an embodiment may impart the outer portion of the protective coating 10, 10', 10" with added moisture repellence.

In other embodiments where at least two materials 12, 14—and the corresponding portions—of a protective coating 10, 10', 10" comprise moisture-resistant materials, the materials 12, 14 of the protective coating 10, 10', 10" may provide different types of moisture-resistance from one another. Such a protective coating 10, 10', 10" may provide a primary type of protection for a majority of the moisture sensitive elements, or components, of a substrate and a secondary type of protection for elements, or components, of the substrate that do not perform as desired or that are otherwise incompatible with the primary type of protection. In some embodiments, the outer portion is impermeable to ultraviolet light. In some embodiments, the outer portion is configured to prevent degradation of the base portion. In some embodiments, there is a discrete boundary between the base portion and the outer portion.

In a specific embodiment, the primary type of protection may comprise a coating or other barrier material that is moisture-impermeable. Such a coating may have a thickness that imparts it with a desired amount of impermeability to moisture. Specific, but non-limiting examples of moisture-impermeable materials include parylenes. A coating formed from such a moisture-impermeable material may have a thickness of about 1 μm (micrometer, or micron) to about 25 μm.

The secondary type of protection of such an embodiment may comprise a material that repels moisture. By way of example, and not by way of limitation, the secondary coating may comprise an ultrathin (with a layer thickness of about 100 Å or less) moisture-repellent material, such as a halogenated (e.g., fluorinated) polymer of the type disclosed by U.S. Reissued Pat. RE43,651 E, the entire disclosure of which is hereby incorporated herein or another fluorinated polymer, or "fluoropolymer." Optionally, moisture repellence may be achieved with films or other structures that include moisture-repellent surface features (e.g., so-called "lotus leaf" structures, other structures that impart a surface with moisture repellence).

As a specific, but non-limiting example of the foregoing, with reference to FIGS. 1-3, material 12 may comprise parylene C, while material 14 may comprise a fluorinated polymer, or "fluoropolymer."

Although the preceding examples are specific, a variety of embodiments of moisture-impermeable materials may be used in a protective coating 10, 10', 10" according to this disclosure. As a non-limiting example, the polymer of a moisture impermeable barrier may comprise an unsubstituted or a substituted poly (p-xylylene), which is more commonly referred to as "parylene." Of course, any other material that may form a moisture impermeable (e.g., watertight) film or structure that will adhere to its intended substrate (e.g., a component configured to be within an interior of an electronic device) over time, during prolonged and/or repeated use of the substrate, while not having a detrimental effect on the substrate and without interfering with the function of the substrate may be used to form a moisture impermeable barrier.

Various types of moisture-repellent materials that may be used in a protective coating 10, 10', 10" according to this disclosure include materials that are compatible with, and that will adhere and remain adhered to other portions of a coating (e.g., adhesion promoters, moisture-impermeable materials, protective materials). The moisture-repellent characteristics of that material of the protective coating 10, 10', 10" may be attributable to one or more factors, including, but not limited to, the chemical properties of a material from which the moisture-repellent portion of the coating is formed, surface features of a moisture-repellant film or other moisture-repellant structure formed by the material (e.g., so-called "lotus leaf" structures, other structures that impart a surface with hydrophobicity and/or moisture-repellence), an electronegativity of the material and/or surface of the moisture-repellent portion, or any other property that contributes to moisture-repellency.

In some embodiments, a hydrophobic or moisture repellent portion of a coating may comprise a fluorinated material. Examples of suitable fluorinated materials include fluorinated parylenes (e.g., parylene AF-4, parylene VT-4), other fluorinated polymers (e.g., polytetrafluoroethylene (PTFE) (or TEFLON®)), a halogenated (e.g., fluorinated) polymer of the type disclosed by U.S. Reissued Pat. RE43,651 E and the like. Some embodiments of the hydrophobic or moisture repellent portion of a coating may comprise a hydrophobic or superhydrophobic material with a rough (e.g., microstructured, nanostructured) surface. Moisture-repellant nanoparticles may also be used as a material 12, 14 of a protective coating 10, 10', 10".

As indicated previously herein, a protective coating 10, 10', 10" may include a material 12 that promotes adhesion of the protective coating 10, 10', 10" or a portion thereof to a substrate or to another portion of the protective coating 10, 10', 10". Such an adhesion-promoting material may be selected on the basis of its ability to adhere to the structures between which the adhesion promote resides (i.e., the substrate and a base portion of the protective coating 10, 10', 10", two portions of the protective coating 10, 10', 10", another coating on an outer surface of the protective coating 10, 10', 10",). A variety of materials may be used to enhance adhesion and/or for any of a variety of other purposes, including, without limitation, ceramic materials, such as aluminum oxide ($Al_2O_3$), which is also commonly referred to as "alumina," boron nitride, or any of a variety of other materials.

Some non-limiting examples of capping materials that may be used as the outermost material 14, 16 of a protective coating 10, 10', 10" include aluminum oxide, diamond-like carbon (e.g., pure carbon, hydrogenated carbon, fluorinated carbon, nitrogenized carbon, phosphorylated carbon, or combinations of any of the foregoing), silicon nitride, a metal oxide such as hafnium (IV) oxide ($HfO_2$), yttrium oxide ($Y_2O_3$) or zirconium dioxide ($ZrO_2$) or the like. As indicated previously herein, such a material may harden or toughen the surface of a protective coating 10, 10', 10", cover passageways through another material 12, 14 (e.g., a parylene, another moisture-impermeable material) of the protective coating 10, 10', 10", or otherwise enhance the functionality, durability (e.g., hardness, impact resistance, scratch resistance, abrasion resistance, wear resistance), of the protective coating 10, 10', 10".

Turning now to FIGS. 4 and 5, embodiments substrates 100, 100', respectively, that include one or more protective coatings 10, 10', 10" are illustrated and described.

FIG. 4 shows an embodiment of a substrate 100; for example, a printed circuit board 110 carrying electronic components 120, 122, 124. One or more protective coatings 10, 10', 10" cover selected areas of the substrate 100. In the depicted embodiment, a protective coating 10, 10', 10" covers components 120 and 122, as well as a portion of the top side 112 of the printed circuit board 110 exposed between the components 120 and 122. In some embodiments, other areas of the substrate 100, such as the portion of the top side 112 of the printed circuit board 110 located between component 122 and component 124, and the component 124, may remain uncoated (i.e., no protective coating 10, 10', 10") is located over these areas of the substrate 100). In addition, peripheral edges 116 of the printed circuit board 100 and a back side 114 of the printed circuit board 110 may be exposed.

In some embodiments, a plurality of different types of protective coatings may cover different areas of a substrate. FIG. 5 is a representation of a substrate 100', such as an assembly or subassembly of an electronic device (e.g., a mobile electronic device, such as a smart phone, a tablet computing device, a digital media player). The substrate 100' of FIG. 5 includes a printed circuit board 110 that carries various components 132, 134, 136, 138. In the depicted embodiment, a protective coating 10, 10', 10" that includes two or more materials 12, 14 (FIGS. 1-3) may cover some areas of the substrate 100', such as components 132 and 134, as well as a portion of the printed circuit board 110 located therebetween. A protective coating that consists of or that consists essentially of a single material 14 may coat another of the components 138 of the substrate 100', while another protective coating that consists of or that consists essentially of another single material 12 may coat yet another component 136.

In a more specific embodiment, material 12 may comprise a moisture-impermeable material (e.g., a parylene), and may be used to protect moisture-sensitive components 132, 134, 136 whose operation may remain substantially unimpeded by a coating of such a material 12. Material 14 may comprise a moisture-repellant material (e.g., a fluoropolymer), which may be applied over areas of material 12 that overlie particularly moisture-sensitive components 132, 134. In addition, such a material 14 may be applied directly to components 138 that will benefit from moisture resistance, but whose operation would be impeded by a coating of a moisture-impermeable material 12. Examples of such components include, but are certainly not limited to, microphones, speakers, optical elements, and the like. Of course, a substrate 100' may include any combination of protective coatings; the immediately preceding disclosure should not be considered to limit the manner in which protective coatings may be combined.

As illustrated by FIGS. 4 and 5, the protective coating(s) 10, 10', 10" and/or material(s) 12, 14 may be confined or substantially confined to components within the interior 210, 210' of an electronic device 200, 200', such as within the interior of the housing or other external components of an electronic device. In other embodiments, a protective coating 10, 10', 10" and/or material 12, 14 may cover at least some components that are exposed to the outside of the electronic device 200, 200'.

Methods for applying one or more materials 12, 14, 16 and/or protective coatings 10, 10', 10" to a substrate 100, 100' are also disclosed. Two or more materials 12, 14 may be applied in a single process. When a single process is used to apply different materials 12, 14 the materials 12, 14 may be chemically similar to one another. With returned reference to FIGS. 1 and 2, in the example of a protective coating 10' in which the material 12 of a base portion comprises parylene C and the material 14 of an outer portion comprises a fluorinated parylene, the deposition process may start with precursors to the parylene C and transition to precursors for the fluorinated parylene. As the deposition process is initiated, all the precursors may comprise precursors to the parylene C. If the transition between precursors to parylene C and fluorinated parylene is abrupt, the resulting protective coating 10 may resemble that illustrated by FIG. 1. If the transition is gradual, the resulting protective coating 10' may resemble that depicted by FIG. 2. At the conclusion of the deposition process, all of the precursors may comprise precursors to the fluorinated parylene.

Alternatively, such a method may include two or more discrete processes in which different materials 12, 14, 16 (FIGS. 1-3) are applied to a substrate 100, 100' (FIGS. 4 and 5). The discrete processes may be carried out by the same equipment, even in the same application zone (e.g., deposition chamber), or by separate apparatuses (e.g., a chemical vapor deposition (CVD) chamber for parylene, including fluorinated parylenes; a PECVD chamber for some fluoropolymers, for a diamond-like coating or for aluminum oxide; an ALD chamber for some fluoropolymers, for a diamond-like coating or for aluminum oxide) may be used to effect the discrete processes.

With regard to the process of depositing multiple types of materials, including parylene, these may be deposited by a plethora of methods. By way of example, parylene C and parylene N will be used herein but are purely for illustrative purposes; any type of parylene or other CVD chemical may be deposited in like manner. It will also be appreciated that the order of the deposition can be interchanged between the different materials and chemicals. The precursors (e.g., dimers) may be loaded or filled into a vaporizer itself or a vaporizer vessel or vessels in the inverse order that the precursors are to be deposited on the substrate. This method requires a single vaporizer. In this instance, a parylene N dimer may be loaded followed by a parylene C dimer, allowing the parylene C dimer to be vaporized first and deposited first, followed by the parylene N dimer being vaporized and then deposited.

Another method includes use of separate vaporizer systems with a single precursor being loaded into each vaporizer or vaporizer vessel. Each vaporizer may be heated and optimized for each precursor type. The system may then be sequenced such that one vaporizer is engaged before the other vaporizer and the deposition of one material is followed by the deposition of the other material.

Another method may include use of a continuous-feed vaporizer system. In this type of system, a dimer or another precursor may be loaded into a vaporizer continuously and in a sequence desired for the coating to be deposited, in order, from a base of the coating to an outer surface of the coating. In this continuous feed method, the precursor is changed over time. Depending upon a variety of factors, including, but not necessarily limited to, the types of precursors, the materials to be deposited, the thicknesses of the coating layers that are to be formed and other characteristics of the coating layers that are to be formed, various parameters of the continuous-feed vaporizer (e.g., thermal parameters) may be varied over time. An alternative to the use of a continuous-feed vaporizer system could be the use of multiple continuous-feed vaporizers, each of which is designated for use with a specific precursor (e.g., a dimer).

In some embodiments, a coating method may also include the application of a mask to selected regions of the substrate to prevent at least one portion of the coating from being applied to those portions. In embodiments where discrete processes are used to form different portions of a coating, the mask may be present while at least one material 12, 14, 16 (FIGS. 1-3) is applied to the substrate 100, 100' (FIGS. 4 and 5), but absent while at least one other material 12, 14, 16 is applied to the substrate; thus, some (masked) portions of the substrate 100, 100' will be covered by fewer portions of a coating than other (unmasked) portions of the substrate. In other embodiments, a mask may remain in place as all materials 12, 14, 16 are applied to the substrate 100, 100'. As a result, none of the materials 12, 14, 16 will cover those areas of the substrate 100, 100'.

Although the foregoing disclosure provides many specifics, these should not be construed as limiting the scope of any of the ensuing claims. Other embodiments may be devised which do not depart from the scopes of the claims. Features from different embodiments may be employed in combination. The scope of each claim is, therefore, indicated and limited only by its plain language and the full scope of available legal equivalents to its elements.

What is claimed:

1. A film for imparting a substrate with moisture resistance, comprising:
   a base portion, which provides moisture resistance, the base portion comprising poly(chloro-p-xylylene);
   an outer portion, which provides protection, the portion comprising poly($\alpha,\alpha,\alpha',\alpha'$-tetrafluoro-p-xylylene); and
   a transition between the base portion and the outer portion, wherein the transition comprises a gradient between a material of the base portion and a material of the outer portion.

2. The film of claim 1, wherein the base portion is moisture-impermeable.

3. The film of claim 2, wherein the outer portion is impermeable to ultraviolet light.

4. The film of claim 2, wherein the outer portion is configured to prevent degradation of the base portion.

5. The film of claim 1, wherein the outer portion is superimposed with respect to the base portion.

6. The film of claim 1, further including regions where the base portion and the outer portion are not superimposed.

7. The film of claim 1, wherein the gradient comprises a gradient between superimposed portions of the base portion and the outer portion.

8. The film of claim 1, further comprising: an adhesion promoter on an opposite side of the base portion from the outer portion.

* * * * *